(12) United States Patent
Ozaki

(10) Patent No.: US 12,740,439 B2
(45) Date of Patent: Sep. 15, 2026

(54) METAL-CERAMIC BONDED SUBSTRATE AND MANUFACTURING METHOD THEREOF

(71) Applicant: DOWA METALTECH CO., LTD., Tokyo (JP)

(72) Inventor: Ayumu Ozaki, Nagano (JP)

(73) Assignee: DOWA METALTECH CO., LTD., Tokyo (JP)

( * ) Notice: Subject to any disclaimer, the term of this patent is extended or adjusted under 35 U.S.C. 154(b) by 189 days.

(21) Appl. No.: 18/682,670

(22) PCT Filed: Jul. 11, 2022

(86) PCT No.: PCT/JP2022/027275

§ 371 (c)(1),
(2) Date: Feb. 9, 2024

(87) PCT Pub. No.: WO2023/047765

PCT Pub. Date: Mar. 30, 2023

(65) Prior Publication Data

US 2024/0395679 A1 Nov. 28, 2024

(30) Foreign Application Priority Data

Sep. 21, 2021 (JP) ................................ 2021-153278

(51) Int. Cl.
*H10W 70/40* (2026.01)
*H10W 40/00* (2026.01)
(Continued)

(52) U.S. Cl.
CPC ....... *H10W 70/461* (2026.01); *H10W 40/255* (2026.01); *H10W 70/047* (2026.01); *H10W 99/00* (2026.01)

(58) Field of Classification Search
CPC ............. H01L 21/4803; H01L 21/4839; H01L 21/4882; H01L 23/367; H01L 23/3735;
(Continued)

(56) References Cited

U.S. PATENT DOCUMENTS 6,686,030 B2 * 2/2004 Tsukaguchi .............. H05K 3/38 428/209
6,936,337 B2 * 8/2005 Tsukaguchi ......... H10W 40/255 428/209
(Continued)

FOREIGN PATENT DOCUMENTS

EP 3 796 761 3/2021
JP 2002-76190 3/2002
(Continued)

OTHER PUBLICATIONS

JP-2019197816-A English Translation (Year: 2019).*
(Continued)

*Primary Examiner* — Amir A Jalali
(74) *Attorney, Agent, or Firm* — GREENBLUM & BERNSTEIN, P.L.C.

(57) ABSTRACT

In a metal-ceramic bonded substrate in which a metal circuit board is bonded to one surface of a ceramic substrate through a brazing material layer, an overhang portion of the brazing material layer overhanging outward by 80 μm or more from a lower edge portion of a side surface of the metal circuit board is formed, the side surface of the metal circuit board has an inclination angle θ of 75° or more with respect to a surface of the ceramic substrate, and the side surface of the metal circuit board and the overhang portion of the brazing material layer are covered with an insulating layer. The metal-ceramic bonded substrate has good partial discharge characteristics and excellent heat cycle resistance and heat resistance.

14 Claims, 5 Drawing Sheets

(51) Int. Cl.

| | |
|---|---|
| ***H10W 40/25*** | (2026.01) |
| ***H10W 70/04*** | (2026.01) |
| ***H10W 99/00*** | (2026.01) |

(58) Field of Classification Search

CPC ............. H01L 23/3736; H01L 23/4924; H01L 23/49568; H01L 2224/32245; H01L 2924/01029; H05K 1/0209; H05K 1/0271; H05K 1/0296; H05K 1/0306; H05K 3/022; B23K 1/0016; B23K 2101/42; C22C 9/00; C22F 1/08; C04B 41/009; C04B 41/4572; C04B 41/52; C04B 2237/124; C04B 2237/127; C04B 2237/407; C04B 2237/706

See application file for complete search history.

(56) References Cited

U.S. PATENT DOCUMENTS

| | | | | |
|---|---|---|---|---|
| 10,160,690 | B2 * | 12/2018 | Kato | C04B 35/584 |
| 11,497,125 | B2 * | 11/2022 | Tsugawa | H05K 3/38 |
| 12,396,092 | B2 * | 8/2025 | Naba | H05K 1/0306 |
| 2016/0211195 | A1 * | 7/2016 | Sunachi | H10W 40/255 |
| 2018/0005918 | A1 * | 1/2018 | Naba | H10W 40/255 |
| 2018/0255645 | A1 * | 9/2018 | Ideno | B23K 1/0016 |
| 2019/0371690 | A1 * | 12/2019 | Iwasaki | H10W 70/692 |
| 2021/0068253 | A1 * | 3/2021 | Kato | H05K 1/0306 |
| 2023/0068210 | A1 * | 3/2023 | Ozaki | B23K 35/025 |
| 2023/0268245 | A1 * | 8/2023 | Yuki | H10W 40/255<br>257/678 |
| 2024/0363480 | A1 * | 10/2024 | Terasaki | H10W 40/255 |

FOREIGN PATENT DOCUMENTS

| | | |
|---|---|---|
| JP | 2004-311691 | 11/2004 |
| JP | 2005-116602 | 4/2005 |
| JP | 2006-228918 | 8/2006 |
| JP | 2016-51778 | 4/2016 |
| JP | 2019197816 A * | 11/2019 |

OTHER PUBLICATIONS

Extended European Search Report received in EP Application No. 22872521.4, dated Mar. 7, 2025.

International Search Report issued in International Patent Application No. PCT/JP2022/027275, dated Sep. 20, 2022.

Written Opinion issued in International Patent Application No. PCT/JP2022/027275, dated Sep. 20, 2022.

* cited by examiner

METAL-CERAMIC BONDED SUBSTRATE AND MANUFACTURING METHOD THEREOF

TECHNICAL FIELD

The present invention relates to a metal-ceramic bonded (circuit) substrate and a manufacturing method thereof, and in particular to a metal-ceramic bonded substrate in which a metal circuit is bonded to a ceramic substrate by a brazing material and a manufacturing method thereof.

BACKGROUND ART

Power modules are conventionally used to control high power in electric vehicles, trains, machine tools, and the like. As insulating substrates for such power modules, metal-ceramic bonded substrates are used, in which plating is applied to chip components on metal circuit boards bonded to one surface of a ceramic substrate and to areas where soldering of terminals is required.

For example, in the case of train applications, operating voltages are as high as 6 to 9 kV, and the metal-ceramic bonded substrate used must be highly reliable and able to withstand such voltages with a sufficient margin. If a partial discharge charge amount increases when high voltage is applied, dielectric breakdown may occur. Increasing an insulation distance (distance between circuit patterns, creepage distance) can suppress partial discharge, but this requires increasing the size of the metal-ceramic bonded substrate, making it difficult to downsize the metal-ceramic bonded substrate and power module.

In addition, such a metal-ceramic bonded substrate is prone to cracks in the ceramic substrate due to thermal stress generated by a thermal expansion difference between the ceramic substrate and the metal circuit board caused by thermal shock after bonding.

As a method to alleviate such thermal stress, it is known to thin a creepage portion of the metal circuit board, that is, to form a stepped structure or a brazing fillet (an overhang portion of brazing material to bond the metal circuit board to the ceramic substrate) at a peripheral edge portion of the metal circuit board.

To suppress partial discharge, for example, in the technology disclosed in Japanese Laid-open Patent Publication No. 2002-76190 (Patent Document 1), a solid insulator is placed on an upper surface of an insulating substrate in contact with an outer peripheral edge of a conductive film of a circuit board to prevent partial discharge from occurring at the outer peripheral edge of the conductive film, preventing the outer peripheral edge from becoming a starting point of dielectric breakdown and improving reliability.

In the technology disclosed in Japanese Laid-open Patent Publication No. 2005-116602 (Patent Document 2), sufficient durability against dielectric withstand voltage and partial discharge characteristics can be obtained even at high voltages such as 6 to 9 kV by applying a coating material to a bonded substrate with brazing material overhang (fillet).

PRIOR ART DOCUMENT

Patent Document

Patent Document 1: Japanese Laid-open Patent Publication No. 2002-76190

Patent Document 2: Japanese Laid-open Patent Publication No. 2005-116602

SUMMARY OF THE INVENTION

Problems to be Solved by the Invention

However, as operation at even higher voltage is expected in the future, there is a problem of degradation of insulation performance due to partial discharge. In recent years, power modules have been required to have higher withstand voltage, partial discharge characteristics, and excellent heat cycle resistance due to chip withstand voltage improvement or other factors. The technology disclosed in Patent Document 1 has good partial discharge characteristics by inserting an insulating substrate into a mold and filling it with resin, but it has poor heat cycle resistance and the resin filling is costly. In addition, the technology disclosed in Patent Document 2 has a maximum partial discharge characteristic of about 9 kV, which is not sufficient.

Furthermore, the inventors have found that the partial discharge characteristics deteriorate due to thermal history when a circuit board is assembled into a power module, in other words, when chip components and heat dissipation plates are formed on the circuit board by soldering or other means.

An object of the present invention is to solve these problems and provide a metal-ceramic bonded substrate with good partial discharge characteristics, excellent heat cycle resistance, and heat resistance, and a manufacturing method thereof.

Means for Solving the Problems

To solve the above problem, the present invention provides a metal-ceramic bonded substrate in which a metal circuit board is bonded to one surface of a ceramic substrate through a brazing material layer, including: an overhang portion of the brazing material layer overhanging outward by 80 μm or more from a lower edge portion of a side surface of the metal circuit board; the side surface of the metal circuit board having an inclination angle of 75° or more with respect to the surface of the ceramic substrate, and an insulating layer covering the side surface of the metal circuit board and the overhang portion of the brazing material layer.

A heat-dissipation-side metal plate may be bonded to the other surface of the ceramic substrate. The heat-dissipation-side metal plate may be copper or a copper alloy. The metal circuit board may be copper or a copper alloy. Nickel plating or nickel alloy plating may be formed on surfaces of the metal circuit board and the overhang portion of the brazing material layer. Also, the insulating layer may be resin. In that case, a main component of the resin may be a polyimide resin.

The present invention provides a manufacturing method of a metal-ceramic bonded substrate in a metal-ceramic bonded body in which a metal plate is bonded to one surface of a ceramic substrate through a brazing material layer, the method including: forming a metal circuit board by removing unnecessary portions of the metal plate; forming an overhang portion of the brazing material layer by making the brazing material layer overhang by 80 μm or more from a lower edge portion of a side surface of the metal circuit board; etching the side surface of the metal circuit board to have an angle of 75° or more with respect to the surface of the ceramic substrate, and then forming an insulating layer to cover the side surface of the metal circuit board and the overhang portion of the brazing material layer.

In a metal-ceramic bonded body in which a metal plate is bonded to one surface of a ceramic substrate through a brazing material layer and a metal plate is bonded to the other surface through a heat-dissipation-side brazing material layer, unnecessary portions of the metal plate on one surface and the metal plate on the other surface may be removed to form the metal circuit board on one surface of the ceramic substrate and a heat-dissipation-side metal plate on the other surface. The heat-dissipation-side metal plate may be copper or a copper alloy. The metal circuit board may be copper or a copper alloy. Nickel or nickel alloy plating may be formed on surfaces of the metal circuit board and the overhang portion of the brazing material. In addition, the insulating layer may be formed by applying a coating material composed of an insulating resin and then curing it. In such a case, a main component of the resin may be a polyimide resin.

Effect of the Invention

The present invention provides a metal-ceramic bonded substrate with good partial discharge characteristics, excellent heat cycle resistance, and heat resistance, and a manufacturing method thereof.

EMBODIMENTS FOR CARRYING OUT INVENTION

An example of an embodiment of the present invention will be described below with reference to the drawings. In this description, substantially similar components will be omitted from redundant explanations by applying the same codes.

<Metal-Ceramic Bonded Substrate>

Figure 1:
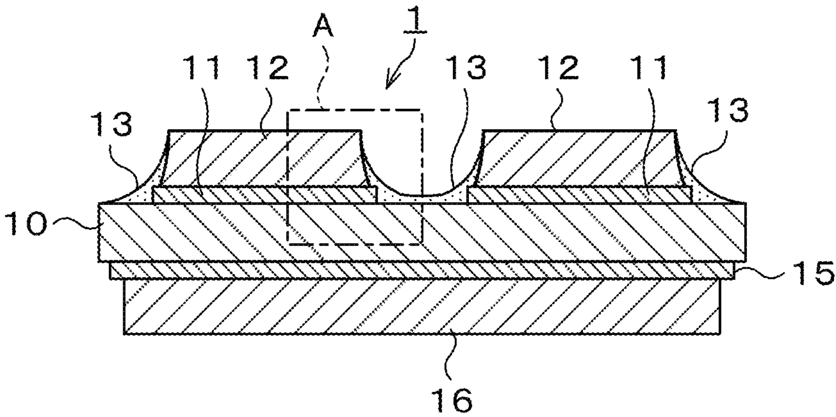
FIG. 1 is a sectional diagram illustrating a metal-ceramic bonded substrate according to an embodiment of the present invention.

As illustrated in FIG. 1, a metal-ceramic bonded substrate 1 according to an embodiment of the present invention has a structure in which one or more metal circuit boards 12 are bonded to at least one surface of a (for example, rectangular) ceramic substrate 10 through a brazing material layer 11. In the illustrated mode, two (for example, substantially rectangular) metal circuit boards 12 are bonded to an upper surface of the ceramic substrate 10 through the brazing material layer 11. A (for example, rectangular) heat-dissipation-side metal plate 16 is bonded to a lower surface of the ceramic substrate 10 through a brazing material layer 15, and further, a heat-dissipation member (not illustrated) such as a heat-dissipation plate material made of metal or composite material called a base plate, a metal heat dissipation fin, or a cooling jacket is attached to a lower surface of the heat-dissipation-side metal plate 16.

The ceramic substrate 10 is preferably made of oxides mainly composed of alumina, silica, and the like or non-oxides mainly composed of aluminum nitride, silicon nitride, silicon carbide, and the like and a substrate with a size of approximately 5 to 200 mm (preferably 10 to 100 mm) long×5 to 200 mm (preferably 10 to 100 mm) wide and 0.25 to 3.0 mm (preferably 0.3 to 1.0 mm) thick can be used.

The brazing material layers 11 and 15 are made of a brazing material containing, for example, an active metal, and silver content in the brazing material (metal component) is preferably 30 mass % or more. When the total metal component in the active metal-containing brazing material is set as 100 mass %, the active metal-containing brazing material composed of 1.0 to 7.0 mass % (preferably 1.5 to 6.5 mass %) active metal, 30 to 95 mass % (preferably 50 to 90 mass %, more preferably 60 to 80 mass %) silver, and copper as the balance can be used. Titanium, zirconium, or hafnium can be used as the active metal in this active metal-containing brazing material. The above-mentioned brazing material may further contain, for example, 10 mass % or less of elements such as Sn and In.

Since chip components such as semiconductor elements are mounted on the metal circuit board 12, the metal circuit board 12 is preferably made of metal with excellent electrical conductivity and thermal conductivity, for example, a single metal such as copper or aluminum, or an alloy such as a copper alloy or aluminum alloy.

The heat-dissipation-side metal plate 16 is preferably made of, for example, copper or a copper alloy, aluminum or an aluminum alloy, to dissipate heat generated from the chip components such as the semiconductor elements mounted on the metal circuit board 12.

On a surface of the heat-dissipation-side metal plate 16 (opposite side of the surface bonded to the ceramic substrate), a base plate made of material such as copper or a copper alloy, aluminum or an aluminum alloy, or Al—SiC-based composite material, heat dissipation fins, a cooling jacket, or other heat-dissipation members (not illustrated) are attached by soldering, bolting, or other means.

Figure 2:
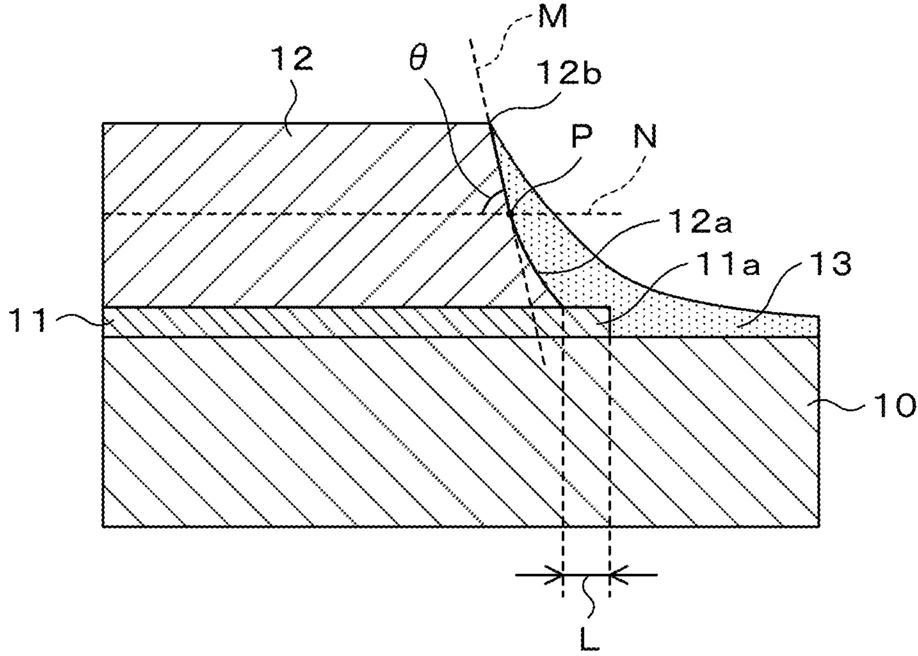
FIG. 2 is an enlarged sectional diagram of Part A in FIG. 1.

As illustrated in FIG. 2 by enlarging Part A in FIG. 1, an overhang portion (fillet) 11*a* is formed on the upper surface of the ceramic substrate 10 so that the brazing material layer 11 overhangs outward from a lower edge portion of a side surface of the metal circuit board 12. An overhang length (fillet length) L of the overhang portion 11*a* is 80 μm or more to effectively relieve thermal stress generated by a thermal expansion difference between the ceramic substrate 10 and the metal circuit board 12. By setting such an overhang length, an insulating layer 13 described below is well formed on a side surface 12*a* of the metal circuit board 12, the overhang portion 11*a*, and the upper surface of the ceramic substrate 10 with gaps such as voids suppressed, which may also improve partial discharge characteristics. The overhang length Lis a protruding length of the overhang portion 11*a* protruding outward from the lower edge portion of the side surface of the metal circuit board 12. The overhang length L is more preferably 90 μm or more. When the overhang length L is too large, an outer shape of the metal-ceramic bonded substrate 1 must be enlarged to secure an insulation distance between patterns, thus hindering miniaturization of the metal-ceramic bonded substrate 1. The overhang length L is preferably 300 μm or less, and even more preferably 200 μm or less.

The side surface of the metal circuit board 12 and the overhang portion 11*a* are covered with the insulating layer 13. The insulating layer 13 is made of, for example, a polyimide resin, an insulating resin.

The side surface 12*a* of the metal circuit board 12 has a shape that is inclined to gradually widen outward from an upper edge (upper corner portion of the metal circuit board 12) 12*b* of the side surface of the metal circuit board 12 as it goes down, or is perpendicular to the upper surface of the ceramic substrate 10. An inclination angle θ of the side surface 12*a* of the metal circuit board 12 with respect to the upper surface of the ceramic substrate 10 is 75° or more, preferably 80° or more, and preferably 100° or less, more preferably 90° or less, and a shape with no overhang is preferred.

In the present invention, the inclination angle θ is defined as an angle formed between a straight line M and the upper surface of the ceramic substrate 10, where a straight line (12*b*-P) connecting the upper edge (upper corner portion) 12*b* of the metal circuit board 12 and a position P at haft the thickness of the metal circuit board 12 (half the height from the upper surface of the ceramic substrate 10 to the upper surface of the metal circuit board 12) of the side surface 12*a* of the metal circuit board 12 is set as the straight line M when the cross-section of the metal-ceramic bonded substrate 1 is observed.

When measuring the inclination angle θ, for convenience, an angle between the straight line M and a straight line N may be measured, when a straight line parallel to the surface of the ceramic substrate 10 in FIG. 2 passing through P is set as the straight line N.

<Manufacturing Method of Metal-Ceramic Bonded Substrate>

Next, an example of a manufacturing method of the metal-ceramic bonded substrate 1 according to the embodiment of the present invention will be described. As illustrated in FIG. 1, the manufacturing method of the metal-ceramic bonded substrate 1 in which the two metal circuit boards 12 are bonded to the upper surface of the ceramic substrate 10 through the brazing material layer 11 will be described as an example.

Figure 3:
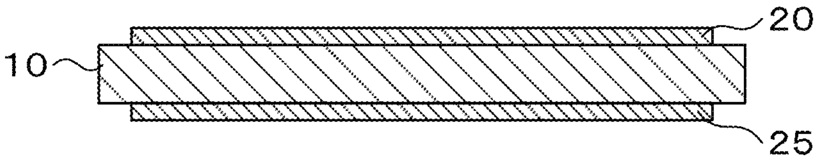
FIG. 3 is an explanatory diagram illustrating an example of a manufacturing method of a metal-ceramic bonded substrate according to an embodiment of the present invention, in which a paste-like active metal-containing brazing material is applied to both surfaces of a ceramic substrate by screen printing.
Figure 4:
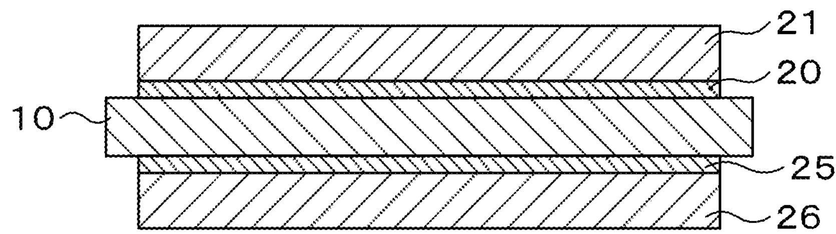
FIG. 4 is an explanatory diagram illustrating an example of the manufacturing method of the metal-ceramic bonded substrate according to the embodiment of the present invention, in which a ceramic substrate and metal plates are bonded through the active metal-containing brazing material.

As illustrated in FIG. 3 and FIG. 4, an active metal-containing brazing material 20 and an active metal-containing brazing material 25 in paste form are respectively applied to the upper and lower surfaces of the ceramic substrate 10 by screen printing, spraying, roll coater, or other known methods. A metal plate 21 and a metal plate 26 are then respectively placed in contact with the active metal-containing brazing material 20 and the active metal-containing brazing material 25, heated in a vacuum or non-oxidizing atmosphere, and then cooled to bond the metal plate 21 and the metal plate 26 to the upper and lower surfaces of the ceramic substrate 10, respectively.

The active metal-containing brazing material 20 may be a metal foil of a brazing material with a predetermined composition to be placed on the upper and lower surfaces of the ceramic substrate 10.

Figure 5:
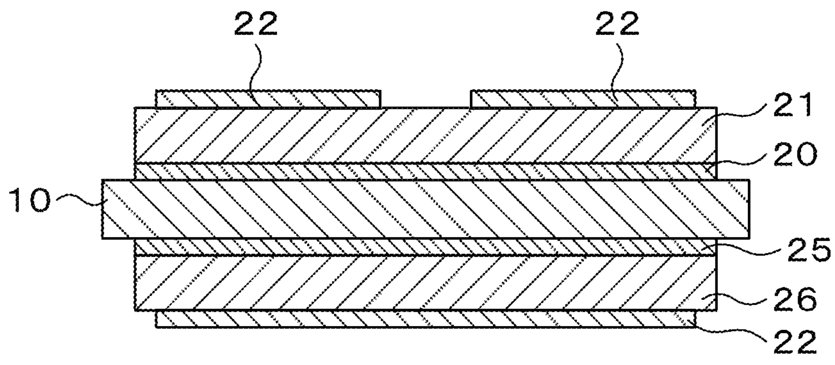
FIG. 5 is an explanatory diagram illustrating an example of the manufacturing method of the metal-ceramic bonded substrate according to the embodiment of the present invention, in which resists with a desired circuit pattern shape and heat-dissipation-side metal plate shape are applied to surfaces of the metal plates bonded to upper and lower surfaces of the ceramic substrate.
Figure 6:
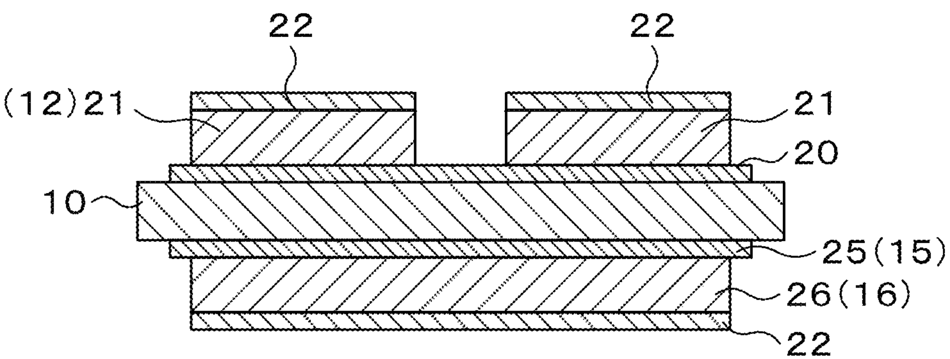
FIG. 6 is an explanatory diagram illustrating an example of the manufacturing method of the metal-ceramic bonded substrate according to the embodiment of the present invention, in which unnecessary portions of the metal plates are etched away.
Figure 7:
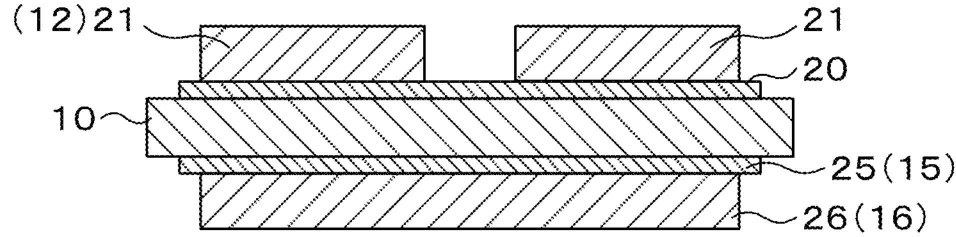
FIG. 7 is an explanatory diagram illustrating an example of the manufacturing method of the metal-ceramic bonded substrate according to the embodiment of the present invention, in which the resists are removed after the unnecessary portions of the metal plates are etched away.

Next, as illustrated in FIG. 5, resists 22 each with a desired circuit pattern and the resist 22 with the (approximately rectangular) heat-dissipation-side metal plate shape are applied to surfaces of the metal plate 21 and the metal plate 26 respectively bonded to the upper and lower surfaces of the ceramic substrate 10. Then, as illustrated in FIG. 6, unnecessary portions of the metal plate 21 and the metal plate 26 are etched away using a cupric chloride etching solution, an iron chloride etching solution, or other etching solutions. Then, the resists 22 are removed as illustrated in FIG. 7.

Figure 8:
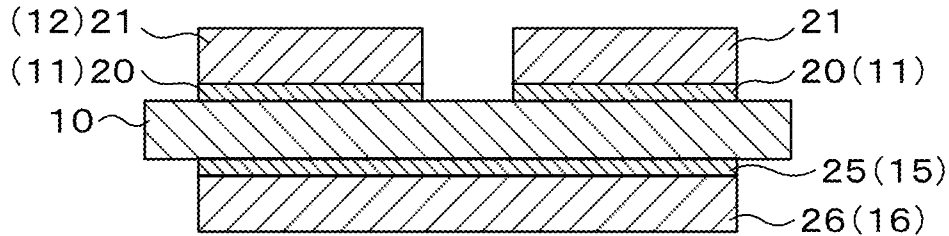
FIG. 8 is an explanatory diagram illustrating an example of the manufacturing method of the metal-ceramic bonded substrate according to the embodiment of the present invention, in which unnecessary portions of the active metal-containing brazing material are removed.

Next, as illustrated in FIG. 8, unnecessary portions of the active metal-containing brazing material 20 and the active metal-containing brazing material 25 (remaining between and around circuit patterns and around the heat-dissipation-side metal plate 16) are removed with, for example, an aqueous solution containing hydrofluoric acid or a compound that forms a complex with an active metal such as ethylenediaminetetraacetic acid (EDTA). By removing the unnecessary portions of the active metal-containing brazing material 20 and the active metal-containing brazing material 25 in this manner, the brazing material layers 11 and the brazing material layer 15 are formed in a predetermined shape (the overhang portions 11*a* that overhang outward from the side surfaces of the metal plates 21 and the metal plate 26 do not appear yet).

Figure 9:
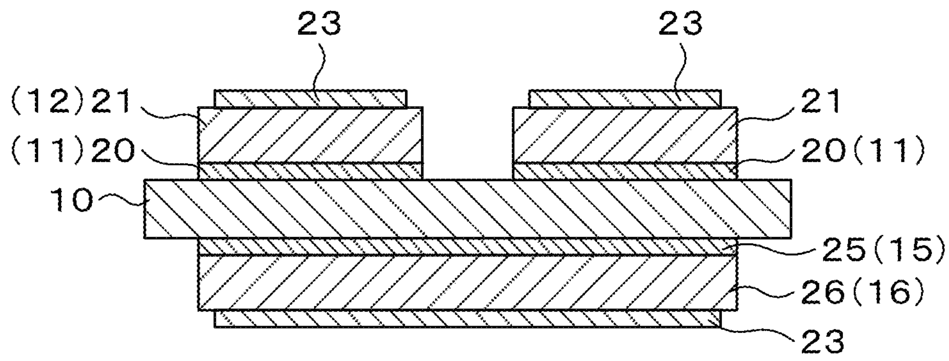
FIG. 9 is an explanatory diagram illustrating an example of the manufacturing method of the metal-ceramic bonded substrate according to the embodiment of the present invention, in which a resist is applied to almost a whole surface of the upper surface (surface) of the metal plates.
Figure 10:
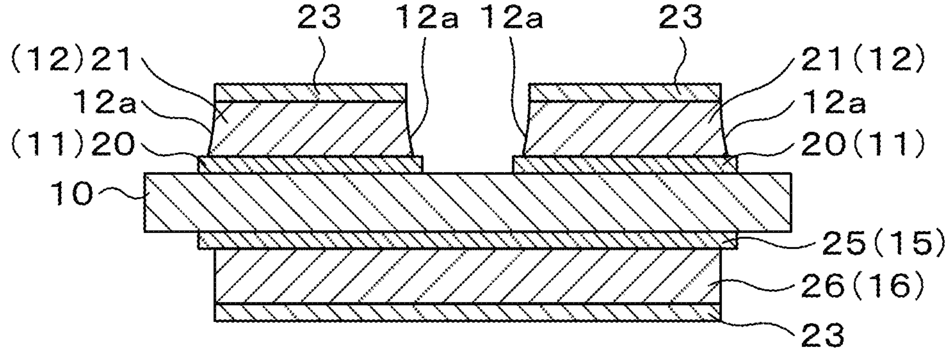
FIG. 10 is an explanatory diagram illustrating an example of the manufacturing method of the metal-ceramic bonded substrate according to the embodiment of the present invention, in which side surfaces of the metal plates (peripheral edge portions of the metal plates) are etched away to allow the active metal-containing brazing materials to overhang from the side surface portions of the metal plates.

Then, as illustrated in FIG. 9, resists 23 are applied to almost whole surfaces of the metal plates 21 and the metal plate 26 on the metal plates 21 and the metal plate 26. The resists 23 are preferably applied so that they have exactly the same shape as the surfaces of the metal plates 21 and the metal plate 26, or so that a peripheral edge portion of each surface (for example, approximately 500 μm or less) is exposed. The resists 23 are almost the same shape as the metal circuit boards 12 and the heat-dissipation-side metal plate 16. Then, as illustrated in FIG. 10, unnecessary portions of the metal plates 21 and the metal plate 26 (side surfaces and peripheral edge portions of the metal plates 21 and the metal plate 26) are etched away with an etching solution containing cupric chloride or iron chloride, a chemical polishing solution, or other solutions so that peripheral portions of the brazing material layers 11 and the brazing material layer 15 are made to overhang from the side surface portions of the metal plates 21 and the metal plate 26. By etching away the unnecessary portions of the metal plates 21 and the metal plate 26 (the peripheral edge portions of the metal plates 21 and the metal plate 26) in this manner, the metal circuit boards 12 and the heat-dissipation-side metal plate 16 each in a predetermined shape are formed. The peripheral portions of the brazing material layers 11 are made to overhang from the side surface portions of the metal plates 21 and the metal plate 26 to form the overhang portions 11*a* and 15*a* having a predetermined overhang length (fillet length) L.

When etching away the unnecessary portions of the metal plates 21 (the side surfaces and the peripheral edge portions of the metal plates 21), etching conditions (resist 23 size, etching solution, etching temperature, and time) should be adjusted so that the overhang length (fillet length) L of the overhang portion 11*a* is 80 μm or more.

By etching the metal circuit board 12 after forming the resist 23, the fillet length L can be controlled to a predetermined length, and the inclination angle θ of the side surface 12*a* of the metal circuit board 12 can be controlled to 75° or more, preferably 80° or more and 100° or less, more preferably 90° or less, without any overhangs. In particular, a fillet width L and the inclination angle θ of the present invention can be obtained by forming the resists 23 on almost the whole surfaces of the metal plates 21 as described above and adjusting the etching conditions to generally achieve the target fillet length L.

Figure 11:
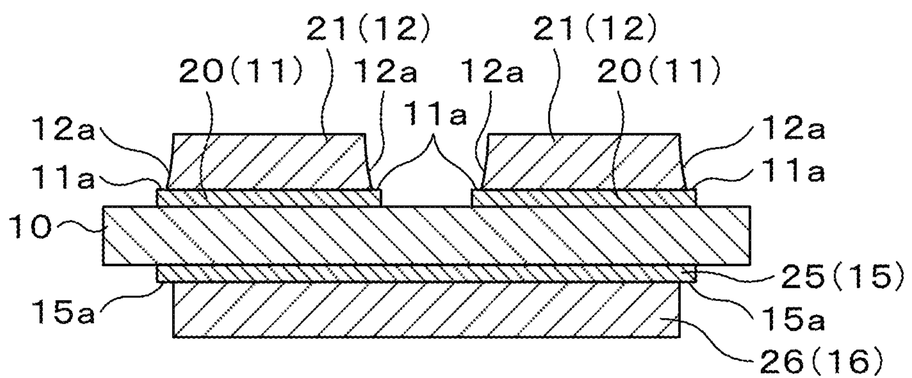
FIG. 11 is an explanatory diagram illustrating an example of the manufacturing method of the metal-ceramic bonded substrate according to the embodiment of the present invention, in which the resists are removed after the side surfaces of the metal plates (the peripheral edge portions of the metal plates) are etched away to allow the active metal-containing brazing materials to overhang from the side surface portions of the metal plates.

The resists 23 are then removed as illustrated in FIG. 11. In this way, the metal plates 21, the metal plate 26, the active metal-containing brazing materials 20, and the active metal-containing brazing material 25 are formed in a predetermined shape to form the metal circuit boards 12, the heat-dissipation-side metal plate 16, the brazing material layers 11, and the brazing material layer 15, and also to form the overhang portions (fillets) 11*a* where the brazing material layers 11 overhang outward from the side surfaces 12*a* of the metal circuit boards 12.

Similarly, on the lower surface of the ceramic substrate 10, the overhang portion (fillets) 15*a* where the brazing material layer 15 overhangs from side surface 16*a* of the heat-dissipation-side metal plate 16 is preferably formed using the same manufacturing method as the metal circuit boards 12.

Figure 12:
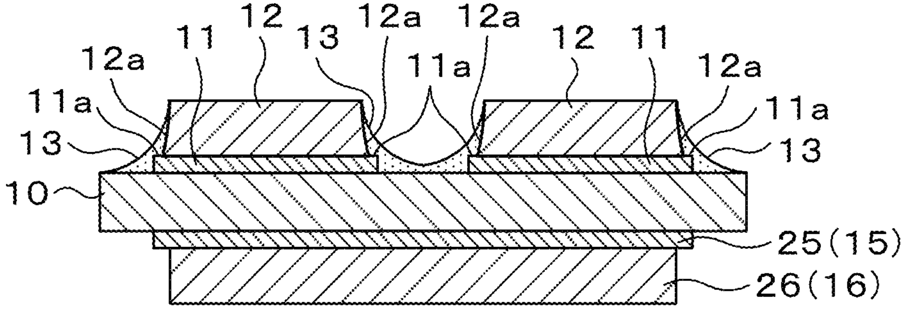
FIG. 12 is an explanatory diagram illustrating an example of the manufacturing method of the metal-ceramic bonded substrate according to the embodiment of the present invention, in which an insulating resin solution is dropped to cover the side surfaces of the metal circuit boards and the overhang portions of the brazing material layers, and then heated in an inert gas atmosphere to cure the insulating resin solution to form an insulating layer.

Next, as illustrated in FIG. 12, an insulating resin solution (insulating layer 13) is dropped to cover the side surfaces 12*a* of the metal circuit boards 12, the overhang portions 11*a* of the brazing material layers 11, and the surface of the ceramic substrate 10. Dropping of the insulating resin solution can be performed by using a resin dispenser or other means. The insulating resin solution is then heated in an inert gas atmosphere to be cured to form the insulating layer 13.

A polyimide resin, or the like is preferred as the insulating resin. For example, the polyimide resin is diluted with a solvent such as N-methyl-2-pyrrolidone (NMP) to make a polyimide resin solution with a viscosity (viscosity measured with an E-type viscometer) at room temperature (25° C.) of 50 to 1000 mPa's (preferably 70 to 900 mPa·s). The polyimide resin solution is then preferably dropped between the metal circuit boards 12 (between circuit patterns) and their surroundings using a resin dispenser or other means to form the insulating layer 13.

If necessary, a Ni plating film may be formed on the metal circuit boards 12 and the overhang portions (fillets) 11*a*, for example, by electric Ni plating or electroless Ni plating. A base plate made of a metal plate or composite material, heat dissipation fins, or a cooling jacket for water cooling, not illustrated, can be attached to the lower surface of the heat-dissipation-side metal plate 16 by soldering, through the brazing material, or the like, for example.

In the metal-ceramic bonded substrate 1 of the embodiment of the present invention thus manufactured, the side surfaces 12*a* of the metal circuit boards 12 with a predetermined angle and the overhang portions 11*a* of the brazing material layers 11 having a predetermined overhang width are covered with the insulating layer 13, and thereby, a metal-ceramic bonded substrate with good partial discharge characteristics and excellent heat cycle resistance can be provided. In addition, the large inclination of the side surface 12*a* of the metal circuit board 12 enhances adhesion strength with the resin, and the overhang portion (fillet) 11*a* has a stress-relaxing effect that prevents cracking of the ceramic substrate 10 even after thermal history is given.

As an example of the embodiment of the present invention, a mode in which two metal circuit boards 12 are bonded to the upper surface of the ceramic substrate 10 through the brazing material layers 11 is shown, but the number of metal circuit boards 12 can be one, three or more, and it is also sufficient if the metal circuit board 12 is bonded to at least one surface of the ceramic substrate 10. It is also preferable that the heat-dissipation-side metal plate 16 is bonded to the other surface of the ceramic substrate 10.

Examples

The following is a detailed description of Examples of metal-ceramic bonded (circuit) substrates and their manufacturing methods according to the present invention. In the following Examples 1 to 4 and Comparative Examples 1 to 6, a metal circuit board and a heat-dissipation-side metal plate (metal plates): oxygen-free copper (length 20 mm, width 14 mm, thickness 0.25 mm), a ceramic substrate: aluminum nitride (length 19.8 mm, width 13.8 mm, thickness 0.635 mm), and a paste-like active metal-containing brazing material: brazing material mainly composed of silver and containing titanium, were prepared. The components of this active metal-containing brazing material are a paste-like active metal-containing brazing material containing 83 mass % silver, 10 mass % copper, 5 mass % tin, and 2 mass % titanium (as an active metal component) as metal components (Ag:Cu:Sn:Ti=83:10:5:2).

Examples 1 to 4

As in the manufacturing method of the metal-ceramic bonded substrate described above, the paste-like active metal-containing brazing material was applied to upper and lower surfaces of the ceramic substrate by screen printing to a thickness of 20 μm, the metal plates were placed in contact with the active metal-containing brazing material, and the substrate was heated to 850° C. in a vacuum furnace, and then cooled to bond the metal plates to the upper and lower surfaces of the ceramic substrate.

Then, an ultraviolet curable alkaline-strippable resist with a circuit pattern shape was applied to a surface of the metal plates bonded to one surface of the ceramic substrate, and the aforementioned resist with a shape of the heat-dissipation-side metal plate was applied to a surface of the metal plate bonded to the other surface by screen printing. After these resists were cured by UV irradiation, unnecessary portions of the metal plates (copper plates) were etched with an etching solution composed of copper chloride, hydrochloric acid, and water as the balance, and the resists were removed with an aqueous sodium hydroxide solution to form metal circuit boards and a heat-dissipation-side metal plate each made of a copper plate.

Next, after immersion in an aqueous chelate solution containing 1.6 mass % EDTA·4Na (sodium salt of ethylenediaminetetraacetic acid), 3 mass % ammonia water, and 5 mass % hydrogen peroxide solution, the resultant was immersed in a well-known brazing material etching solution composed of an aqueous chelate solution containing 2 mass % ethylenetriaminepentaacetic acid (DTPA)·5Na and 5 mass % hydrogen peroxide solution. Unnecessary portions of the active metal-containing brazing material remaining between copper circuit patterns on the surface of the ceramic substrate, around the heat-dissipation-side copper plate, and the like were removed by immersion to obtain an intermediate product.

Subsequently, the resists were applied to whole surfaces of the metal circuit boards and the heat-dissipation-side metal plate of the intermediate product by screen printing, and then side surfaces of the metal circuit boards and the heat-dissipation-side metal plate were etched (chemically polished) by immersing in an etching solution (chemical polishing solution) composed of 14 mass % sulfuric acid, 3.2 mass % hydrogen peroxide solution, and water as the balance at a liquid temperature of 45° C. to form overhang portions of the brazing material (brazing material fillets) where the active metal-containing brazing material was made to overhang by a predetermined length from side surface portions of the circuit-side copper plates and the heat-dissipation-side copper plate to obtain the metal-ceramic bonded substrate.

In Examples 1 to 4, a fillet length of approximately 100 μm was targeted.

Next, a 4 μm thick Ni—P alloy plating film was formed on the surfaces of the metal circuit boards and the heat-dissipation-side metal plate and on the overhang portions of the brazing material by electroless plating.

Next, a polyimide resin solution was dropped and applied between and around the metal circuit boards (between circuit patterns) using a resin dispenser (discharge pressure: 0.25 MPa, discharge time: 2 msec, discharge interval: 0.5 mm/shot), followed by heat curing at 250° C. for 30 minutes to form an insulating layer. The resultants were used as evaluation samples.

Figure 13:
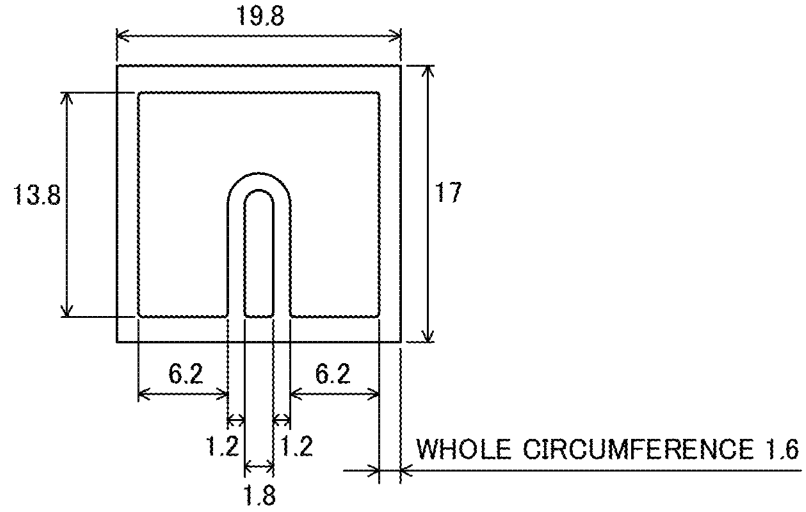
FIG. 13 is an explanatory diagram of board dimensions and metal circuit board shapes (circuit pattern dimensions) of Examples 1 to 4 and Comparative Examples 1 to 6.

Substrate dimensions and metal circuit board shapes (circuit pattern dimensions) of Examples 1 to 4 and Comparative Examples 1 to 6 are illustrated in FIG. 13.

Comparative Examples 1 to 3

As in Examples, the paste-like active metal-containing brazing material was applied to the upper and lower surfaces of the ceramic substrate by screen printing, and the metal plates were placed in contact with the active metal-containing brazing material, which were then heated and cooled to bond the metal plates to the upper and lower surfaces of the ceramic substrate. Subsequently, metal-ceramic bonded substrates of Comparative Examples 1 to 3 were obtained by resist printing→etching→resist removal→brazing material layer removal→electroless Ni—P plating→polyimide application. In other words, the substrates were fabricated by the same manufacturing method as in Examples except for the fillet formation (and simultaneous side surface inclination angle control of the metal circuit board) process, and no fillets existed in Comparative Examples 1 to 3.

Comparative Examples 4 to 6

As in Examples, the paste-like active metal-containing brazing material was applied to the upper and lower surfaces of the ceramic substrate by screen printing, and the metal plates were placed in contact with the active metal-containing brazing material, which were then heated and cooled to bond the metal plates to the upper and lower surfaces of the ceramic substrate. Subsequently, metal-ceramic bonded substrates of Comparative Examples 4 to 6 were obtained by resist printing→etching→resist removal→brazing material layer removal→chemical polishing→electroless Ni—P plating→polyimide application. In Comparative Examples 4 to 6, the process differs from Examples in that chemical polishing (fillet formation) was performed without forming the resists on the surfaces of the metal plates after the brazing material removal, and the fillet length of approximately 50 μm was targeted. In Comparative Examples 4 to 6, the thickness of the metal circuit board became thinner and the upper surface of the metal circuit board became round.

Figure 14:
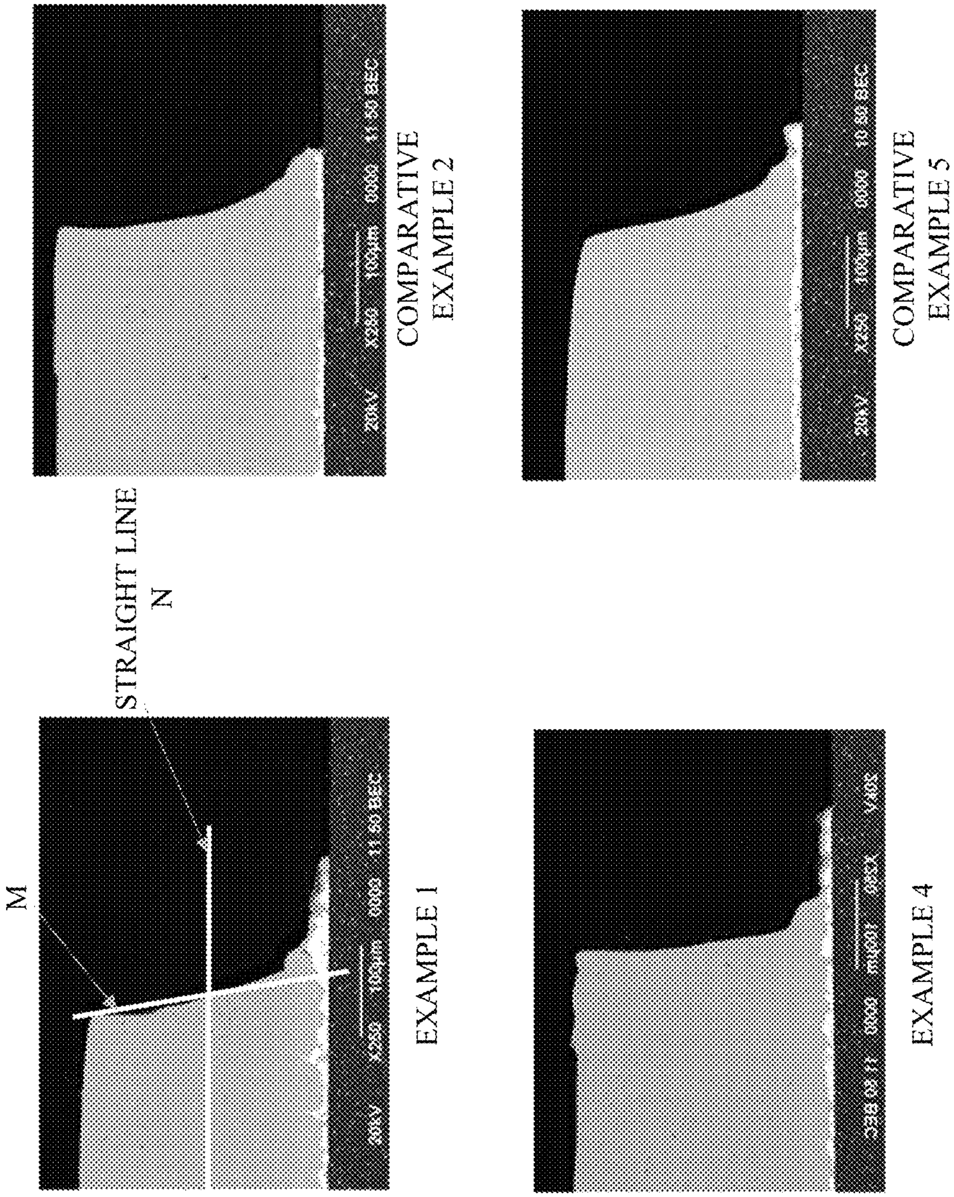
FIG. 14 includes sectional photographs illustrating metal circuit boards and fillet shapes of metal-ceramic bonded substrates of Examples 1, 4, and Comparative Examples 2, 5.

Sectional shapes of the metal circuit boards and fillets of Examples 1, 4, and Comparative Examples 2, 5 are illustrated in FIG. 14. Each photograph in FIG. 14 is a cross-section of the evaluation sample, the metal-ceramic bonded substrate with Ni—P plating, perpendicular to the surface of the ceramic substrate and perpendicular to edges (outer periphery) of the circuit pattern.

The partial discharge of the metal-ceramic bonded substrate was measured by the following method. First, Al wires were connected to the surface of each of the plurality of metal circuit boards by ultrasonic bonding to thereby electrically connect between the metal circuit boards. Next, with the metal-ceramic bonded substrate immersed in insulating oil, a voltage was applied between the metal circuit board and the heat-dissipation metal plate and boosted by 0.5 kV and then stepped down by 0.5 kV using a partial discharge measuring device (partial discharge measuring device DAC-PD-3 manufactured by Soken Electric Co., Ltd.). A partial discharge charge amount at each voltage was measured. Threshold values of the discharge charge amount were set at 10 pC (picocoulomb) and 5 pC (picocoulomb), and the voltage that occurred above the respective threshold values of the discharge charge amount was recorded as an initiation voltage, and the voltage that fell less than the respective threshold values of the discharge charge amount as an extinction voltage.

The heat cycle resistance was evaluated by holding the metal-ceramic bonded substrate at −40° C. for 30 minutes and at 150° C. for 30 minutes as one cycle and returning it to room temperature every 50 cycles to check for cracks in the ceramic.

The evaluation samples of Comparative Examples 1 to 3 without fillets had good partial discharge characteristics, and the partial discharge characteristics were maintained after heat treatment at 380° C. However, the heat cycle resistance (HC) characteristics were inferior because cracks were generated in the ceramic substrate after 50 heat cycles. The heat treatment was a furnace passing treatment (nitrogen 80: hydrogen 20) in which the temperature was raised from room temperature to 380° C. in 10 minutes, held at 380° C. for 10 minutes, and then returned to room temperature in 5 minutes.

Comparative Examples 4 to 6, in which the angle of the side surface (Cu side surface) of the metal circuit board was 75° or less and the fillet length was 70 μm or less, were found to have inferior partial discharge characteristics because the partial discharge extinction voltage after heat treatment was sometimes 10 kV or less.

On the other hand, Examples 1 to 4, in which the angle of the side surface (Cu plate side surface) of the metal circuit board was 80° or more in cross-section and the fillet exceeded 90 μm, had partial discharge initiation voltage and partial discharge extinction voltage of 13 kV or more after polyimide application before heat treatment. In the partial discharge measurement after the heat treatment, the partial discharge extinction voltage was 12 kV or more even under conditions with a discharge charge amount of less than 5 pC. As a result, a metal-ceramic bonded substrate with good partial discharge characteristics and excellent heat cycle resistance could be obtained in Examples 1 to 4.

TABLE 1

| | | ANGLE FROM HALF POSITION OF THICKNESS OF Cu PLATE TO Cu UPPER EDGE ANGLE | FILLET LENGTH | PARTICAL DISCHARGE MEASUREMENT (WITHOUT HEAT TREATMENT) INITIATION VOLTAGE [kV] | | EXTINCTION VOLTAGE [kV] | |
|---|---|---|---|---|---|---|---|
| | | ° | um | >10 pC | >5 pC | <10 pC | <5 pC |
| EXAMPLE 1 | 1 | 83 | 100 | 16 | 14.5 | 16 | 13.5 |
| EXAMPLE 1 | 2 | 83 | 92 | 16 | 15 | 16 | 14.5 |
| EXAMPLE 1 | 3 | 86 | 100 | 17 | 15 | 17 | 14.5 |
| EXAMPLE 1 | 4 | 88 | 98 | 17 | 15.5 | 17 | 14.5 |
| COMPARATIVE EXAMPLE 1 | 1 | 84 | 0 | 17.5 | 15 | 17 | 15 |
| COMPARATIVE EXAMPLE 2 | 2 | 85 | 0 | 17 | 15 | 17 | 14 |
| COMPARATIVE EXAMPLE 3 | 3 | 83 | 0 | 17.5 | 15.5 | 16 | 13.5 |
| COMPARATIVE EXAMPLE 4 | 1 | 66 | 62 | 16.5 | 13.5 | 16.5 | 13 |
| COMPARATIVE EXAMPLE 5 | 2 | 68 | 47 | 17.5 | 15 | 17 | 14 |
| COMPARATIVE EXAMPLE 6 | 4 | 69 | 57 | 17.5 | 16 | 15.5 | 14.5 |

| | PARTIAL DISCHARGE MEASUREMENT (AFTER HEATING AT 380° C. FOR 10 MINUTES) INITIATION VOLTAGE [kV] | | EXTINCTION VOLTAGE [kV] | | | HC CHARACTERISTIC |
|---|---|---|---|---|---|---|
| | >10 pC | >5 pC | <10 pC | <5 pC | <2 pC | CYCLE |
| EXAMPLE 1 | 16.5 | 15.5 | 16.5 | 13.5 | 12 | 300 OR MORE |
| EXAMPLE 1 | 17.5 | 15 | 15.5 | 15 | 12 | 300 OR MORE |
| EXAMPLE 1 | 17.5 | 15.5 | 17.5 | 14.5 | 13.5 | 300 OR MORE |
| EXAMPLE 1 | 17 | 15.5 | 17 | 15 | 12.5 | 300 OR MORE |
| COMPARATIVE EXAMPLE 1 | 17 | 15 | 16 | 15 | 11 | 50 OR LESS |
| COMPARATIVE EXAMPLE 2 | 17 | 15.5 | 16.5 | 12.5 | 12.5 | 50 OR LESS |
| COMPARATIVE EXAMPLE 3 | 18.5 | 15 | 17 | 15 | 12.5 | 50 OR LESS |
| COMPARATIVE EXAMPLE 4 | 16 | 11 | 16 | 9.5 | 5 | 300 OR MORE |
| COMPARATIVE EXAMPLE 5 | 17.5 | 15 | 16.5 | 7.5 | 5 | 300 OR MORE |
| COMPARATIVE EXAMPLE 6 | 18 | 15.5 | 17 | 14.5 | 5 | 300 OR MORE |

EXPLANATION OF CODES

1 metal-ceramic bonded substrate
10 ceramic substrate
11 brazing material layer
11*a* overhang portion (fillet)
12 metal circuit board
12*a* side surface
12*b* upper edge (upper corner portion)
13 insulating layer
15 brazing material layer
15*a* overhang portion (fillet)
16 dissipation-side metal plate
20 active metal-containing brazing material
21 metal plate
22, 23 resist

The invention claimed is:

1. A metal-ceramic bonded substrate in which a metal circuit board is bonded to one surface of a ceramic substrate through a brazing material layer, comprising:

an overhang portion of the brazing material layer overhanging outward by 80 μm or more from a lower edge portion of a side surface of the metal circuit board;

the side surface of the metal circuit board having an inclination angle in a range of 75° or more to 100° or less with respect to the surface of the ceramic substrate, the inclination angle is defined as an angle formed between a first straight line, which connects an upper edge of the metal circuit board and a position on the side surface at half a thickness of the metal circuit board, and a second straight line that extends parallel to the one surface of the ceramic substrate and passes through the position on the side surface, and an insulating layer covering the side surface of the metal circuit board and the overhang portion of the brazing material layer.

2. The metal-ceramic bonded substrate according to claim 1, wherein a heat-dissipation-side metal plate is bonded to another surface of the ceramic substrate that is opposite the one surface.

3. The metal-ceramic bonded substrate according to claim 2, wherein the heat-dissipation-side metal plate is copper or a copper alloy.

4. The metal-ceramic bonded substrate according to claim 1, wherein the metal circuit board is copper or a copper alloy.

5. The metal-ceramic bonded substrate according to claim 1, wherein nickel plating or nickel alloy plating is formed on surfaces of the metal circuit board and the overhang portion of the brazing material layer.

6. The metal-ceramic bonded substrate according to claim 1, wherein the insulating layer is resin.

7. The metal-ceramic bonded substrate according to claim 6, wherein a main component of the resin is a polyimide resin.

8. A manufacturing method of manufacturing the metal-ceramic bonded substrate according to claim 1, the manufacturing method comprising:

in manufacturing the metal-ceramic bonded substrate, a metal-ceramic bonded body in which a metal plate is bonded to the one surface of the ceramic substrate through the brazing material layer;

forming the metal circuit board by removing unnecessary portions of the metal plate; forming the overhang portion of the brazing material layer by making the brazing material layer overhang by 80 μm or more from the lower edge portion of the side surface of the metal circuit board; etching the side surface of the metal circuit board to have the inclination angle in the range of 75° or more to 100° or less with respect to the surface of the ceramic substrate; and then forming the insulating layer to cover the side surface of the metal circuit board and the overhang portion of the brazing material layer.

9. The manufacturing method according to claim 8, comprising: bonding, through a heat-dissipation-side brazing material layer, another metal plate to another surface of the ceramic substrate that is opposite the one surface through a heat dissipation side brazing material layer; and forming the metal circuit board on the one surface of the ceramic substrate and forming a heat-dissipation-side metal plate on the another surface by removing unnecessary portions of the metal plate on the one surface and the metal plate on the another surface.

10. The manufacturing method according to claim 9, wherein the heat-dissipation-side metal plate is copper or a copper alloy.

11. The manufacturing method of according to claim 8, wherein the metal circuit board is copper or a copper alloy.

12. The manufacturing method according to claim 8, further comprising:

forming nickel plating or nickel alloy plating on surfaces of the metal circuit board and the overhang portion of the brazing material layer.

13. The manufacturing method according to claim 8, further comprising:

forming the insulating layer by applying and then curing a coating material composed of an insulating resin.

14. The manufacturing method according to claim 13, wherein a main component of the insulating resin is a polyimide resin.

* * * * *